(12) United States Patent
Kong et al.

(10) Patent No.: US 10,063,159 B1
(45) Date of Patent: Aug. 28, 2018

(54) ADAPTIVE SYNCHRONOUS RECTIFIER SENSING DEGLITCH

(71) Applicant: DIALOG SEMICONDUCTOR INC., Campbell, CA (US)

(72) Inventors: Pengju Kong, Campbell, CA (US); Tao Li, Campbell, CA (US); Hien Bui, Campbell, CA (US); Wenbo Liang, Campbell, CA (US); Hanguang Zhang, Campbell, CA (US)

(73) Assignee: DIALOG SEMICONDUCTOR INC., Campbell, CA (US)

( * ) Notice: Subject to any disclaimer, the term of this patent is extended or adjusted under 35 U.S.C. 154(b) by 0 days.

(21) Appl. No.: 15/640,315

(22) Filed: Jun. 30, 2017

(51) Int. Cl.
*H02M 3/335* (2006.01)
*H02M 1/08* (2006.01)
*H03K 5/1252* (2006.01)

(52) U.S. Cl.
CPC ......... *H02M 3/33592* (2013.01); *H02M 1/08* (2013.01); *H03K 5/1252* (2013.01)

(58) Field of Classification Search
CPC ............... H02M 1/08; H02M 3/33576; H02M 3/33584; H02M 3/33592; H03K 5/125; H03K 5/1252
See application file for complete search history.

(56) References Cited

U.S. PATENT DOCUMENTS

| 6,246,593 B1* | 6/2001 | Cheng | H02M 3/33592 363/127 |
| 7,688,602 B2* | 3/2010 | Hu | H02M 1/08 363/21.14 |
| 7,876,584 B2* | 1/2011 | Havanur | H02M 3/33592 363/21.13 |
| 2016/0190946 A1* | 6/2016 | Fu | H02M 3/33546 363/21.02 |
| 2016/0218634 A1* | 7/2016 | Du | H02M 7/217 |

* cited by examiner

*Primary Examiner* — Matthew Nguyen
(74) *Attorney, Agent, or Firm* — Haynes and Boone, LLP (57) ABSTRACT

A synchronous rectifier controller for controlling the on and off periods of a synchronous rectifier switch transistor in a switching power converter. In particular, the synchronous rectifier controller is configured to adaptively enable and disable a deglitch filter for filtering a turn-on signal for the synchronous rectifier switch transistor. In this fashion, the synchronous rectifier switch transistor may be switched on more rapidly during periods when the deglitch filter is disabled for greater efficiency yet the switching power converter is protected by the deglitch filter when it is not disabled.

30 Claims, 7 Drawing Sheets

ADAPTIVE SYNCHRONOUS RECTIFIER SENSING DEGLITCH

TECHNICAL FIELD

This application relates to synchronous rectification in a switching power converter, and more particularly to a switching power converter with adaptive synchronous rectifier sensing deglitch.

BACKGROUND

Due to the isolation provided by its transformer, a flyback switching power converter is typically selected as the power adapter for portable electronic devices. In particular, the transformer in a flyback converter safely isolates the load from the AC mains. A controller regulates the switching of a power switch over successive power cycles to regulate the output voltage of a flyback converter. The power switch is in series with a primary winding of a transformer so that when it is switched on, a primary current builds up magnetic energy in the transformer. While the primary current flows, the secondary winding must be prevented from conducting current. An output diode may rectify the secondary current to prevent it from flowing while the power switch is cycled on. Such synchronous rectification needs no control but the output diode is lossy such that efficiency suffers. It is thus conventional to increase efficiency by replacing the output diode with a synchronous rectifier (SR) switch transistor.

An SR controller on the secondary side of the transformer monitors a voltage (for example, the drain-to-source voltage) of the SR switch transistor to determine when the power switch transistor has cycled off so that the SR switch transistor may then be cycled on. But the drain-to-source ($V_{D-S}$) voltage across the SR switch transistor is subject to noise such as from associated electrostatic discharge (ESD) circuitry. The resulting noise on the $V_{D-S}$ voltage can cause the SR controller to switch on the SR switch transistor while the primary switch is still on, resulting in large output currents and possible system damage. It is thus conventional to filter the $V_{D-S}$ voltage to prevent glitches on the $V_{D-S}$ voltage from improperly triggering an on-cycle for the SR switch transistor. But such deglitch filtering delays the on-time for normal cycles of the SR switch transistor, which lowers efficiency.

Figure 1:
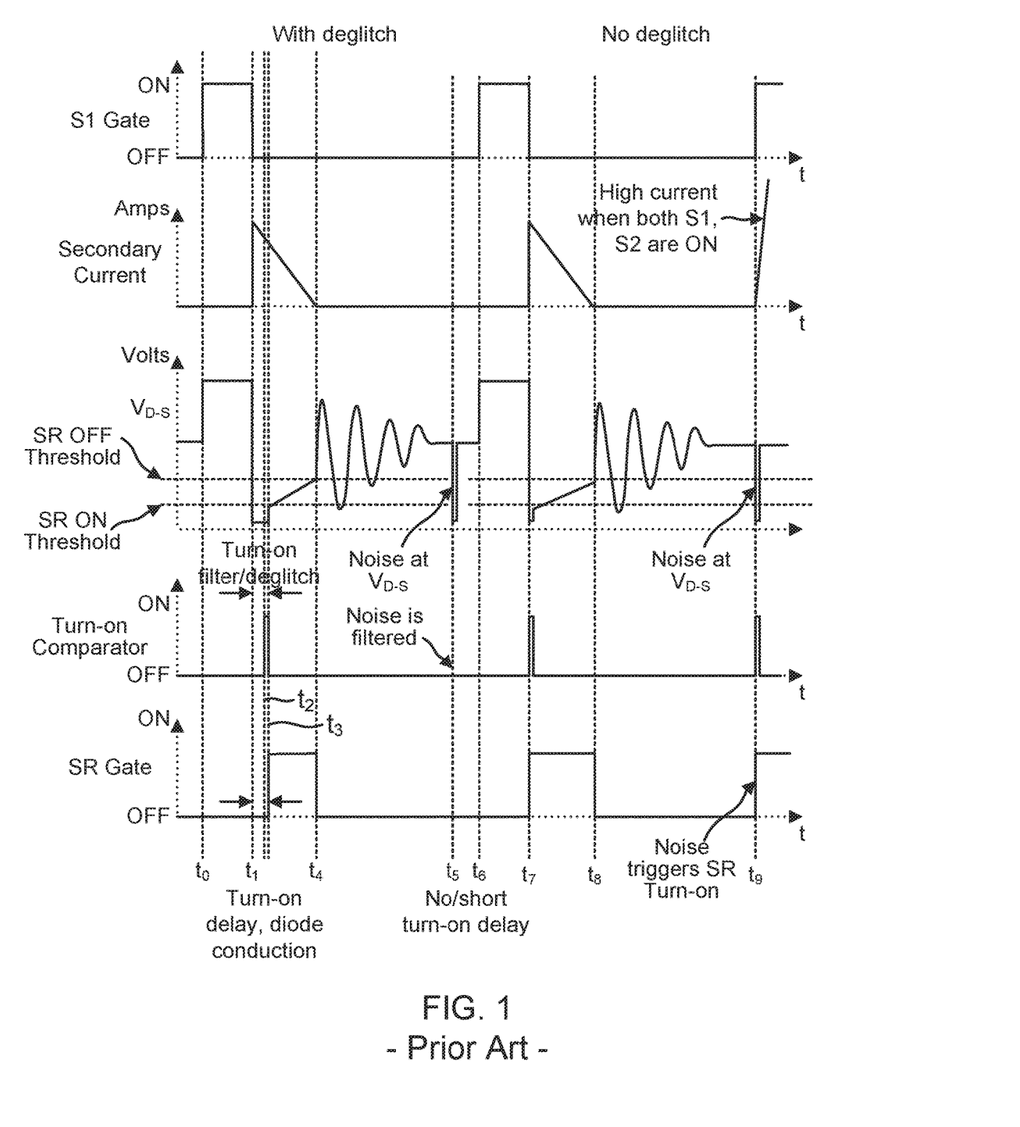
FIG. 1 illustrates some waveforms for a conventional flyback converter.

Operation with and without a deglitch filter may be better understood with reference to the waveforms shown in FIG. 1. From a time t0 to a time t1, the gate voltage (S1 gate) of a power switch transistor is pulsed high for a power cycle with a deglitch filter having a relatively long delay. A secondary current is prevented from flowing during this time. The $V_{D-S}$ voltage across the SR switch transistor pulses high from time t0 to time t1. At time t1, the cycling off of the power switch transistor S1 causes the $V_{D-S}$ voltage to drop below an SR on threshold voltage for switching on the SR switch transistor. In the absence of a deglitch filter, an output of a turn-on comparator comparing the $V_{D-S}$ voltage to the SR on threshold voltage would pulse high at time t1. But the deglitch filter delays the $V_{D-S}$ voltage to provide a filtered output voltage to the turn-on comparator. The output of the turn-on comparator thus does not pulse high until a time t2. The deglitch filter thus introduces a turn-on deglitch delay from time t1 until time t2. In response to the pulsing high of the turn-on comparator output signal, the SR gate voltage for the SR switch transistor is pulsed high at a time t3 shortly after time t2. While the SR switch transistor is on, the $V_{D-S}$ voltage increases until it passes an SR off threshold voltage at a time t4 (the transformer reset time) such that the SR switch transistor is cycled off. The $V_{D-S}$ voltage then begins to resonantly oscillate. At time t1, the secondary current pulses high and then ramps down to zero at time t4.

At a time t5, noise on the $V_{D-S}$ voltage such as resulting from ESD circuitry cause a sharp decrease in the $V_{D-S}$ voltage so that the SR on threshold is momentarily crossed. But the deglitch filtering of the $V_{D-S}$ voltage prevents the turn-on comparator from pulsing its output signal so that the glitch in the $V_{D-S}$ voltage is harmless. At a time t6, another cycle of the power switch transistor S1 begins with a pulsing high of the S1 gate voltage until a time t7, when the power switch transistor S1 is cycled off. But in this power cycle, there is no deglitch filtering such that the turn-on comparator output signal pulses high at time t7. The SR switch is then cycled on so that the secondary current again pulses high and ramps down to zero at a time t8 when the $V_{D-S}$ voltage crosses the SR off threshold voltage so that the SR switch transistor is cycled off. The $V_{D-S}$ voltage again begins to resonantly oscillate. At a time t9, the S1 gate voltage is again pulsed high to begin another power switch cycle. But a glitch on the $V_{D-S}$ voltage at time t9 also causes the SR gate voltage to be pulsed high such that the secondary current quickly ramps to a dangerous level due to the SR switch transistor being on while the power switch transistor S1 is on. Operation without the deglitch filter is more efficient due to the rapid response to the cycling off of the power switch transistor S1 but comes with such a risk of catastrophic failure of the flyback converter.

There is thus a need in the art for improved synchronous rectification for switching power converters offering increased efficiency while still being robust to noise-induced glitches.

SUMMARY

To address the need in the art for improved deglitch filtering for synchronous rectification (SR), an SR controller for a switching power converter is provided with a deglitch control circuit for controlling whether a deglitch filter is disabled during a disablement period. During the disablement period, the SR controller may compare an unfiltered version of a drain-to-source voltage ($V_{D-S}$) for an SR switch transistor to an SR turn-on threshold voltage to determine whether the SR switch transistor should be switched on. In this fashion, efficiency for the switching power converter is increased as compared to a conventional thresholding of a deglitch-filtered version of the $V_{D-S}$ voltage to determine the SR switch on time. Following the disablement period, the SR controller again enables the deglitch filter so that the deglitched-filtered version of the $V_{D-S}$ voltage is compared to the SR turn-on threshold voltage to determine whether the SR switch transistor should be switched on. The resulting switching power converter is thus protected from glitch-induced switching on of the SR switch transistor despite its increased efficiency during the disablement period from the disabling of the deglitch filter.

As used herein, a deglitch filter is deemed to be disabled if its output signal is not used in a threshold comparison to the SR turn-on threshold voltage. Alternatively, the deglitch filter may be configured to use a smaller delay during the disablement period such that the deglitch-filtered version of the $V_{D-S}$ voltage is compared to the SR turn-on threshold voltage despite the deglitch filter being disabled.

These advantageous features may be better appreciated through a consideration of the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 2:
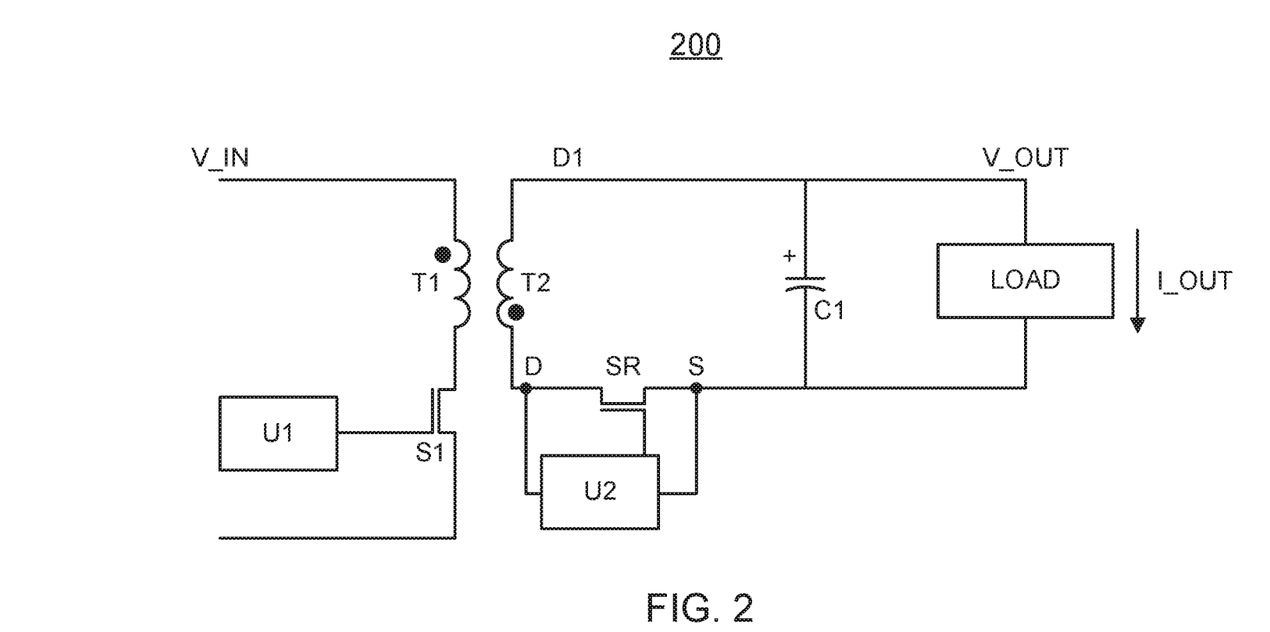
FIG. 2 is a circuit diagram of a flyback converter including an SR controller configured with an adaptive deglitch filter in accordance with an aspect of the disclosure.

Turning now to the drawings, an example flyback converter 100 is shown in FIG. 2 that includes a synchronous rectifier (SR) controller (U2) configured to adaptively apply a SR deglitch filter (not shown in FIG. 2 but discussed further below) such that the SR deglitch filter is deactivated if a pulse of a power switch transistor S1 is detected. Following the deactivation, the SR controller cycles on an SR switch transistor S2 responsive to detecting that a drain-to-source ($V_{D-S}$) voltage across the SR switch transistor S2 has dropped below a switch-on threshold voltage. The SR controller then reactivates the SR glitch filter after the SR switch transistor is cycled off and prior to a detection of a subsequent pulsing on of the power switch transistor S1. The resulting adaptive control of the SR glitch filter is quite advantageous in increasing efficiency because the delay between the power switch transistor S1 cycling off and the SR switch transistor cycling on is reduced as compared to the delay caused by a conventional always-on SR glitch filter. Despite this increase in speed, flyback converter 100 is protected from system malfunction by the reactivation of the SR glitch filter following the switching off of the SR switch transistor at the transformer reset time such that SR switch S2 is not improperly cycled on in response to a noise glitch on the $V_{D-S}$ voltage.

In flyback converter 100, a primary-side controller U1 controls the cycling of a power switch transistor S1 in series with a primary winding T1 of a transformer including a secondary winding T2. When controller U1 cycles power switch transistor S1 on, an input voltage V_IN such as from the rectification of an AC mains voltage causes a primary current to begin increasing in the primary winding T1. While the primary current flows, an SR controller U2 maintains SR switch transistor S2 off. Since SR switch transistor S2 is in series with the secondary winding T2, a secondary current does not flow while SR switch transistor S2 is off. After power switch S1 is cycled off, the SR controller switches SR switch transistor S2 on so that a secondary current flows through the secondary winding T2 to charge an output capacitor with an output voltage V_OUT and to force an output current $I\_OUT$ through a load.

As will be discussed further herein, the SR controller includes an adaptive deglitch filter that may be disabled in response to a detection that the power switch transistor S1 has been cycled on. The adaptive deglitch filter is not re-enabled until an deglitch-on event occurs such as the SR switch transistor being cycled on following the cycling off of the power switch transistor S1. There is thus a disablement period for the adaptive deglitch filter from the detection of the cycling on of the power switch transistor S1 to the deglitch-on event. In alternative embodiments, the adaptive deglitch filter is instead configured to operate with a reduced amount of delay during the disablement period. Following the termination of the disablement period, the adaptive deglitch filter operates with a sufficient amount of delay so as to safely filter out glitches on the $V_{D-S}$ voltage.

Figure 3A:
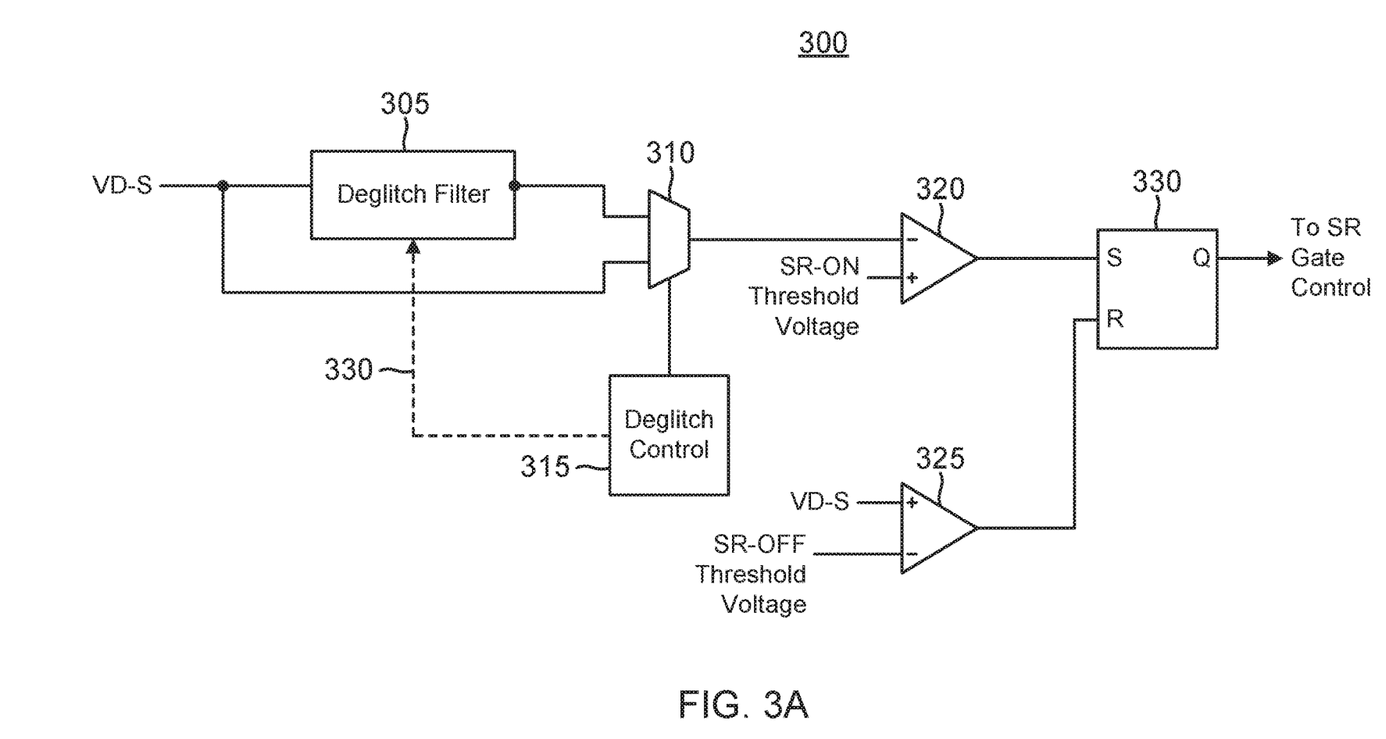
FIG. 3A is a diagram of the SR controller of FIG. 2 in which the deglitch filter filters the drain-to-source voltage in accordance with an aspect of the disclosure.

An example SR controller 300 is shown in more detail in FIG. 3A. A deglitch filter 305 filters the $V_{D-S}$ voltage to produce a filtered $V_{D-S}$ voltage. Such deglitch filtering may be performed using an analog RC circuit. Alternatively, deglitch filter 305 may comprise a digital filter to produce the filtered $V_{D-S}$ voltage. A deglitch control circuit 315 controls a multiplexer 310 to select between the filtered $V_{D-S}$ voltage and the $V_{D-S}$ voltage responsive to whether the disablement period has expired as will be discussed further herein. An output signal selected by multiplexer 310 thus equals the $V_{D-S}$ voltage during the disablement period and equals the filtered $V_{D-S}$ voltage outside of the disablement period. Alternatively, deglitch control circuit 315 may control the amount of delay applied by deglitch filter 305 through a control signal 330 such that it applies less delay during the disablement and more delay outside of the disablement period. A comparator 320 compares the output signal from multiplexer 310 to the SR-on threshold voltage. Comparator 320 will thus assert a set signal to a latch 330 when the multiplexer output signal falls below the SR-on threshold voltage. An SR gate driver (not illustrated) responds to the setting of the Q output from latch 330 by switching on the SR switch transistor (e.g., by charging the gate of the SR switch transistor in an NMOS embodiment). In an embodiment in which deglitch control circuit 315 controls the amount of delay applied by deglitch filter 305, multiplexer 310 would be absent such that comparator 320 would receive the filtered $V_{D-S}$ voltage directly from deglitch filter 305. A comparator 325 resets latch 330 responsive to the $V_{D-S}$ voltage exceeding an SR-off threshold voltage. The SR gate driver responds to the resetting of latch 330 by switching off the SR switch transistor.

Deglitch control circuit 315 initiates the disablement period responsive to a detection of the cycling on of the power switch transistor S1. Referring again to FIG. 2, SR controller U2 has a terminal coupled to the source (S) of the SR switch transistor and has another terminal coupled to the drain (D) of the SR switch transistor to monitor the $V_{D-S}$ voltage. As shown in FIG. 1, the $V_{D-S}$ voltage is driven high in response to the switching on of the power switch transistor S1. In particular, the $V_{D-S}$ voltage will be driven to equal the input voltage V_IN to the flyback converter divided by the primary-to-secondary turn ratio ($n_{ps}$) plus the output voltage V_OUT ($V_{D-S}=V\_IN/n_{ps}+V\_OUT$) in response to the switching on of power switch transistor S1. But note that the input voltage V_IN depends upon AC mains voltage (which varies from country to country). The AC mains voltage being rectified to produce the input voltage V_IN will thus be subject to a fairly wide variation such as from 90 Vac to 265 Vac, which produces a corresponding wide variation in the input voltage V_IN. In general, the ratio of V_IN/$n_{ps}$ approximately equals V_OUT while the AC mains voltage is around 90 Vac or lower. The ratio of V_IN/$n_{ps}$ becomes markedly higher at higher AC mains voltages. Deglitch control circuit 315 may thus detect the initiation of the disablement period responsive to a detection that the $V_{D-S}$ voltage is greater than, for example, 2*V_OUT.

In contrast to the initiation of the disablement period, the termination of the disablement period may be responsive to a number of alternative factors. For example, deglitch control circuit 315 may be responsive to the turn on or off of the SR switch transistor, the expiration of a delay after the turn on or off of the SR switch transistor, or the expiration of a delay after the turn off of the power switch transistor S1 with regard to terminating the disablement period.

Figure 3B:
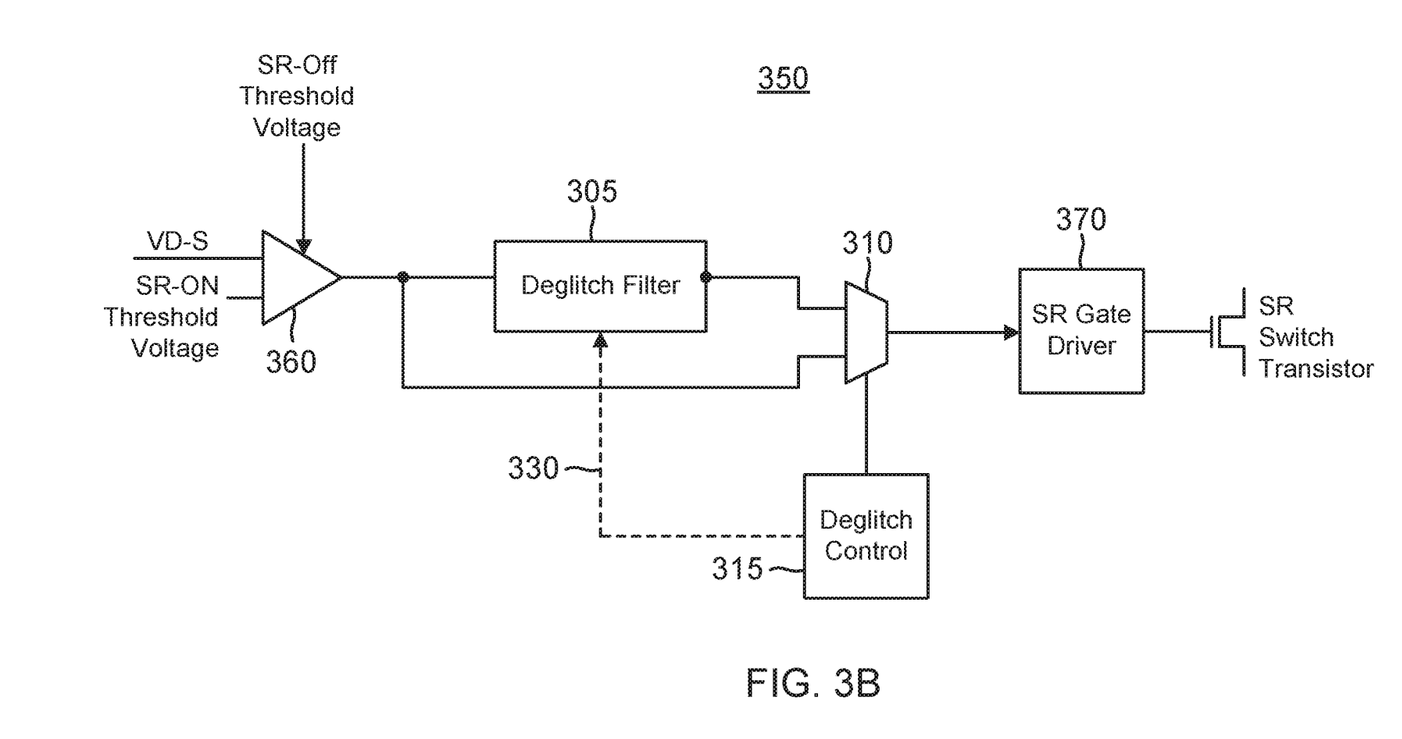
FIG. 3B is a diagram of the SR controller of FIG. 2 in which the deglitch filter filters the comparator output in accordance with an aspect of the invention.

Note that the deglitch filtering may instead be applied to the output of comparator 320 as shown for an example SR controller 350 in FIG. 3B. A comparator 360 asserts its comparator output signal responsive to the $V_{D-S}$ voltage dropping below the SR-ON threshold voltage. Comparator 360 has hysteresis such that it does not de-assert its comparator output signal until the $V_{D-S}$ voltage exceeds the SR-OFF threshold voltage. In such an embodiment, deglitch filter 305 may merely delay the rising edge of the comparator output signal. The falling edge is not filtered. In the case of noise, the resulting delay of the rising edge but not the falling edge simply filters out any pulsing of the comparator output. If, however, the comparator output remains asserted for a sufficiently long period, the delay of the rising edge still provides some pulse width to the deglitch filter output such that the SR switch transistor may be activated. SR controller 350 then functions as discussed with regard to SR controller 300 in that deglitch control circuit 315 controls multiplexer 310 to select between the unfiltered and filtered signals. If the multiplexer output is asserted, an SR gate driver 370 drives the gate of the SR switch transistor accordingly to switch it on. When the multiplexer output signal is de-asserted, SR gate driver 370 switches off the SR switch transistor. Alternatively, multiplexer 310 may be discarded such that the deglitch control circuit 315 controls the application of the filtering in deglitch filter 305 through control signal 330. In such an embodiment, gate driver 370 would be responsive to the assertion and de-assertion of the deglitch filter 305.

Figure 4:
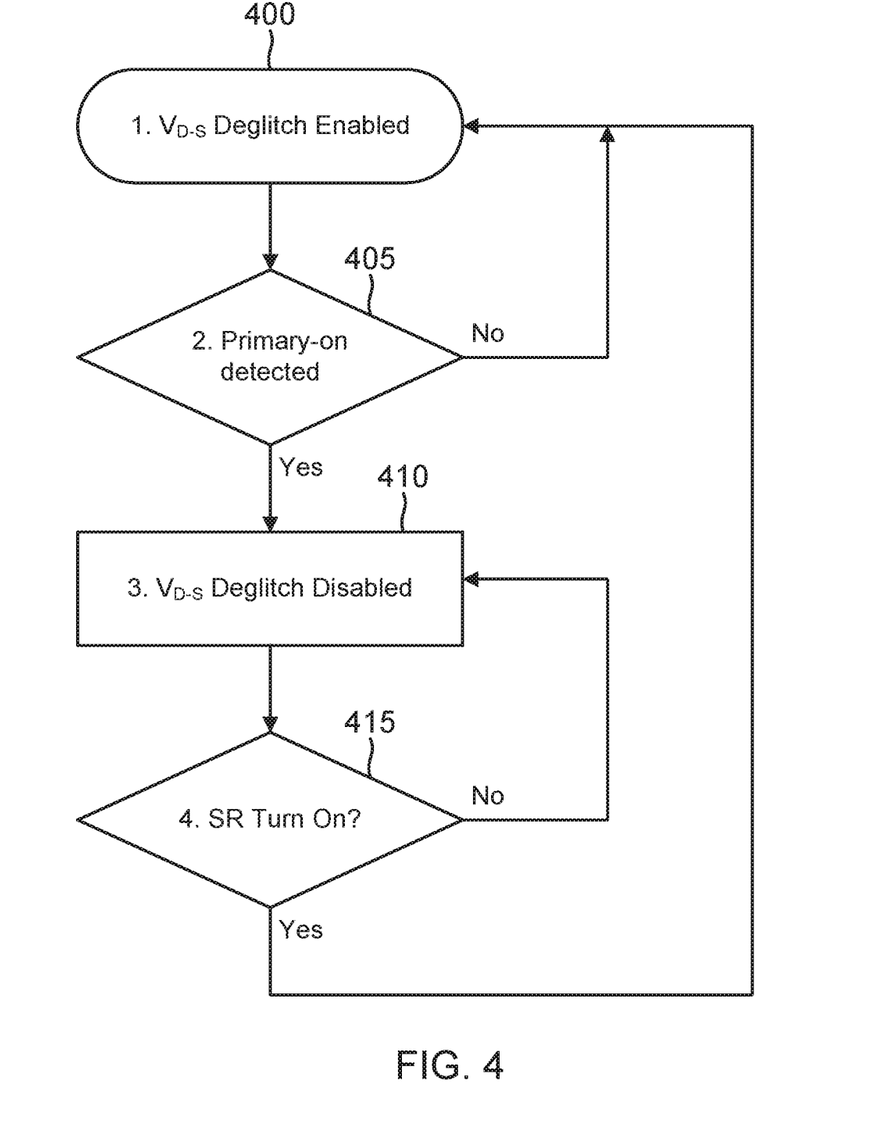
FIG. 4 is a flowchart for a method of enabling and disabling the deglitch filter in the SR controller of FIG. 3A or 3B in accordance with an aspect of the disclosure.

The resulting control with regard to the selective enablement and disablement of the deglitch filter is the same for both SR controllers 300 and 350. A flowchart for the selective enablement and disablement of a deglitch filter responsive to the turn on of the SR switch is shown in FIG. 4. The method begins with a default act of enabling the deglitch filter in a step 400. The detection of whether the power switch transistor S1 is switched on is performed in a step 405. Should the power switch transistor S1 be switched on, the deglitch filter is disabled in an act 410. An example of such disablement occurs when multiplexer 310 is forced to select for the $V_{D-S}$ voltage instead of the delayed $V_{D-S}$ voltage from deglitch filter 305 of FIG. 3A or 3B. After the disablement of the deglitch filter, the method continues with an act 415 that determines whether the SR switch transistor has switched on. If so, the method continues with act 400.

If the determination in step 415 is negative, the method continues with act 410. Similarly, if the determination in step 405 is negative, step 400 is repeated.

The determination in step 405 may be performed by determining whether the $V_{D-S}$ voltage is greater than 2*V_OUT as discussed previously. But should the input voltage V_IN be low, the $V_{D-S}$ voltage may not exceed 2*V_OUT such that the deglitch filter is always enabled, resulting in low efficiency for periods of low input voltage. In addition, the resonant ringing of the $V_{D-S}$ voltage after the transformer reset time may exceed the 2*V_OUT threshold such that the deglitch filter is disabled despite the power switch transistor S1 being off. Glitches on the $V_{D-S}$ voltage could then lead to the SR switch transistor being switched on at the same time the power switch transistor is cycled on for the next power cycle, resulting in system damage from the abnormally-high output current that results from the primary and second winding currents flowing at the same time. As an alternative to using the output voltage as a threshold for the detection of the power switch turn on, it is possible to measure the magnetic flux (volt-second) in the secondary winding from the $V_{D-S}$ voltage to detect the turn on of the power switch transistor. During discontinuous conduction mode (DCM) operation, the volt-second for the magnetic flux in the primary winding is given by V_IN*Ton=$i_{pri\_peak}$*Lm, where Ton is the power switch on time, $i_{pri\_peak}$ is the peak primary current, and Lm is the magnetizing inductance for the primary winding. The volt-second measured from the $V_{D-S}$ voltage during the primary current on-time depends upon the primary peak current $i_{pri\_peak}$. In contrast, the volt-second measured from the $V_{D-S}$ voltage following the transformer reset time depends upon the output voltage V_OUT. The volt-second during the primary current on-time is thus typically much higher than the volt-second resulting from the oscillatory ringing of the $V_{D-S}$ voltage following the transformer reset time. Thus, in some embodiments, deglitch control circuit 315 of FIGS. 3A and 3B is configured to measure a volt-second of the $V_{D-S}$ voltage. If the measured volt-second is greater than a maximum volt-second expected from the oscillatory ringing but less than would be expected across the full on-time of the power switch transistor, a primary-on event is deemed to be detected. However, using the volt-second of the $V_{D-S}$ voltage in this fashion has some limitations.

For example, the ideal volt-second threshold will vary with different flyback converter designs. External components may thus be necessary to adjust the volt-second threshold for different designs. In addition, the peak primary current $i_{pri\_peak}$ cannot be too small to ensure that the minimum volt-second of the primary on time is larger than that of the oscillatory ringing period. Moreover, the output voltage has a number of different levels in fast charge applications. The ringing and the primary on-time will then vary with the output voltage level such that it becomes difficult to choose a volt-second threshold for the various output voltage levels.

Figure 5:
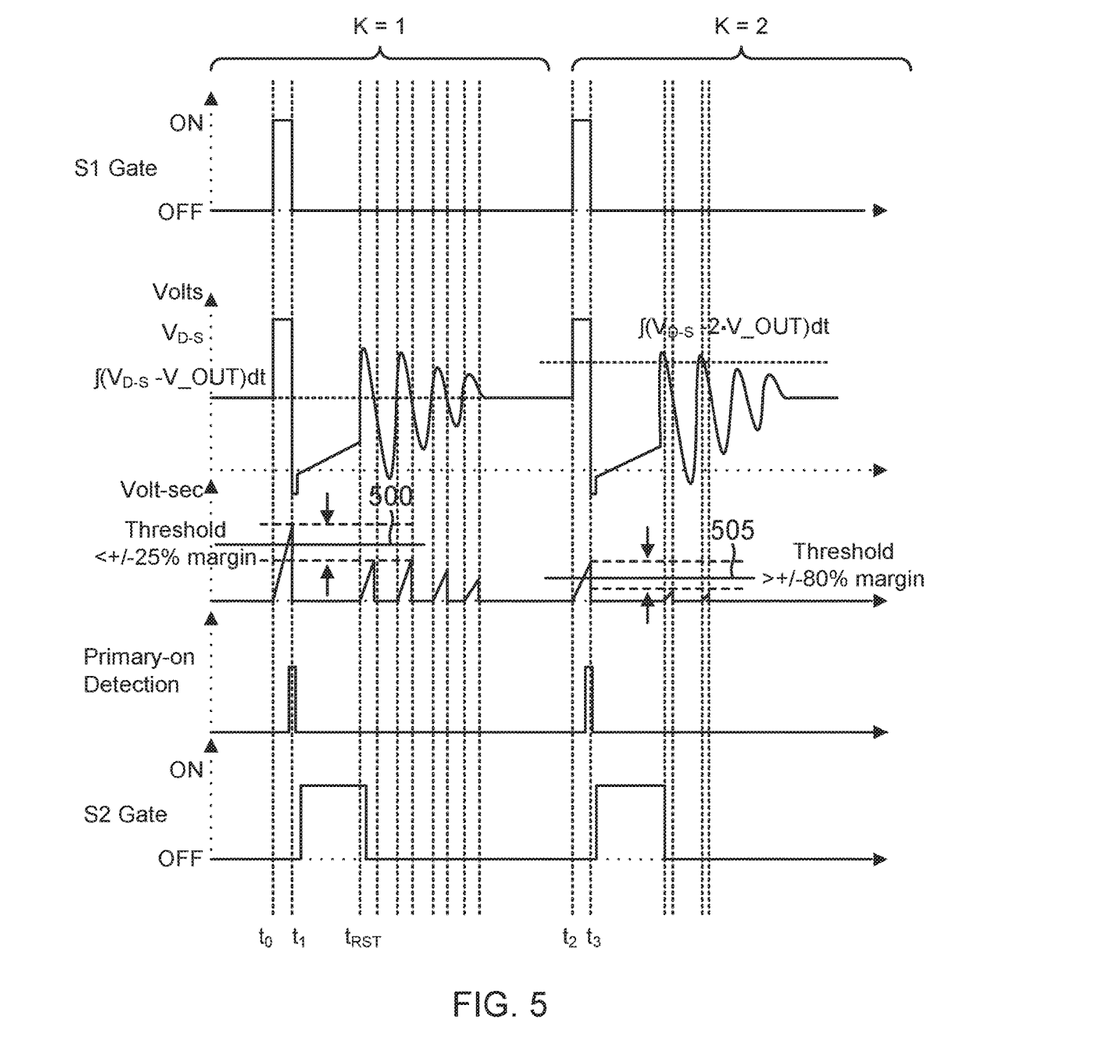
FIG. 5 illustrates some waveforms for a flyback converter having an SR controller configured with an adaptive deglitch filter in accordance with an aspect of the disclosure.

An alternative embodiment for the deglitch control circuit 315 thus uses the volt-second of a difference voltage equaling ($V_{D-S}$−k*V_OUT), where k is a coefficient such as two. The volt-second then equals the integral of $V_{D-S}$−k*V_OUT. The ringing of the $V_{D-S}$ voltage barely exceeds 2*V_OUT in most circumstances. Moreover, even if the ringing exceeds 2*V_OUT, the resulting volt-second from the integration of $V_{D-S}$−k*V_OUT is small such that it is relatively easy to differentiate the ringing from the primary current on-time. Some waveforms for a flyback converter using the integration of $V_{D-S}$−k*V_OUT to determine the volt-second is shown in FIG. 5. At a time t0, the S1 gate voltage for the power switch transistor is pulsed high. This switching on of the power switch transistor causes the $V_{D-S}$ voltage to pulse high until a time t1 when the power switch transistor S1 is cycled off. FIG. 5 also shown the integration of $V_{D-S}$–k*V_OUT, with k=1 to produce a volt-second that exceeds a threshold 500. But note that threshold 500 has only a 25% margin of its value with regard to the volt-second pulses that occur following a transformer reset time $t_{RST}$. In contrast, a second pulse of the S1 gate voltage occurs at a time t2 during which k=2. The volt-second resulting from an integration of $V_{D-S}$–2*V_OUT during the power switch on-time from time t2 to a time t3 exceeds a threshold 505 that has a 80% margin over the oscillatory ringing volt-second. Accordingly, the integration of $V_{D-S}$–2*V_OUT provides a volt-second that enables a more robust distinction between the power switch on-time and the oscillatory ringing of the $V_{D-S}$ voltage.

Figure 6:
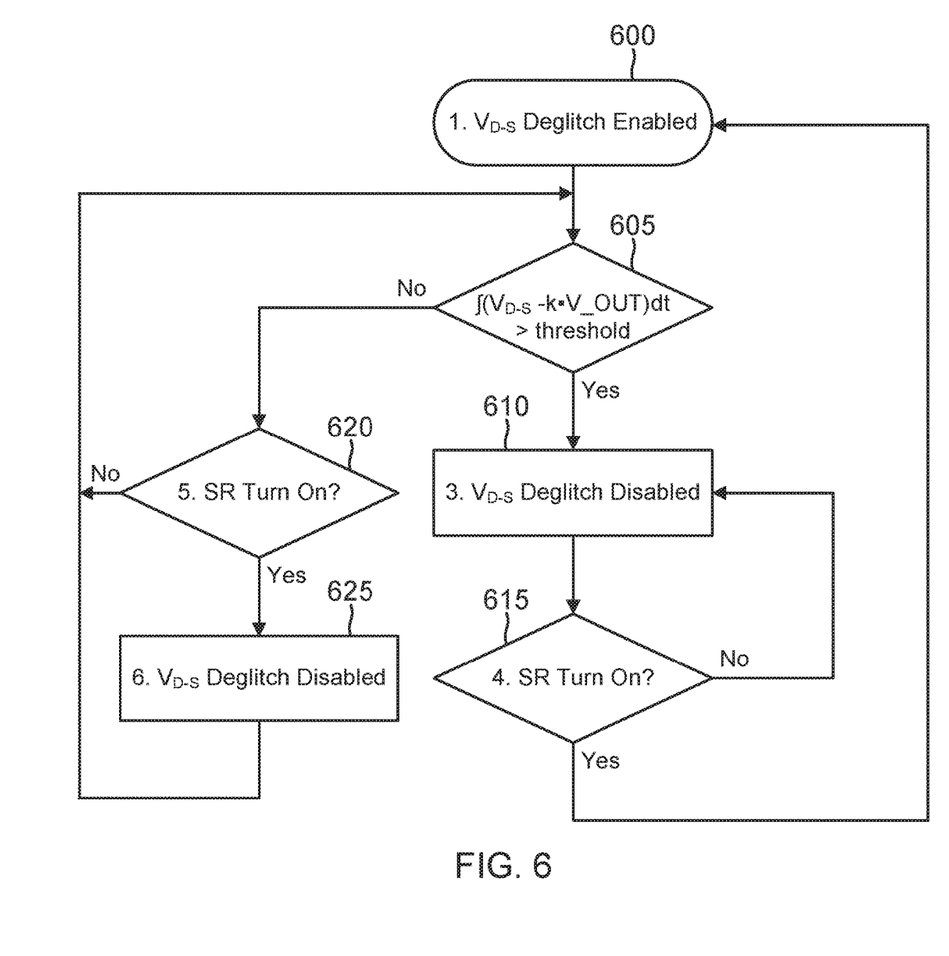
FIG. 6 is a flowchart for a method of enabling and disabling the deglitch filter in the SR controller of FIG. 3A or 3B with respect to a volt-second threshold in accordance with an aspect of the disclosure.

Deglitch control circuit 315 of FIGS. 3A and 3B may thus be configured to practice the volt-second-based thresholding method illustrated in the flowchart of FIG. 6. The method begins with a default act 600 of enabling the deglitch filter. In a step 605, the integration of $V_{D-S}$–k*V_OUT is compared to a threshold. Should the integration exceed the threshold, the deglitch filter is disabled in a step 610 followed by a step 615 of determining whether the disablement period should be terminated. As discussed above, step 615 may be performed in a number of alternative techniques such as by determining whether the SR switch transistor has been switched on. If the disablement period determination is positive, the method continues with act 600. If the determination in step 615 is negative, the method continues with act 610.

If the determination in act 605 is negative, the method continues with an act 620 of determining whether the disablement period should be terminated such as in response to determining whether the SR switch transistor has been switched on. If the determination in act 620 is positive, the deglitch filter is disabled in an act 625 so that the method continues with act 605. If the determination in act 620 is negative, the method continues with act 605.

Referring again to deglitch control circuit 315, it may be configured to integrate $V_{D-S}$–k*V_OUT using, for example, an operational-amplifier integrator. Alternatively, deglitch control circuit 315 may include a current source that produces a current proportional to the $V_{D-S}$–k*V_OUT signal. The current source charges a capacitor with the current such that the voltage across the capacitor is proportional to the integration of $V_{D-S}$–k*V_OUT.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A synchronous rectifier (SR) controller, comprising:
   a deglitch filter for filtering a drain-to-source voltage for an SR switch transistor to produce a filtered version of the drain-to-source voltage;
   a multiplexer for selecting between the filtered version of the drain-to-source voltage and the drain-to-source voltage to provide an output signal;
   a deglitch control circuit configured to control the multiplexer to select for the drain-to-source voltage responsive to a detection that a power switch connected to a primary winding for a flyback converter has been switched on; and
   a first comparator configured to assert a switch-on signal for the SR switch transistor responsive to the output signal being less than an SR-on threshold voltage.

2. The SR controller of claim 1, wherein the deglitch control circuit is further configured to integrate a function of the drain-to-source voltage to determine whether the power switch has been switched on.

3. The SR controller of claim 2, wherein the function equals the drain-to-source voltage minus a product of a coefficient k with an output voltage for the flyback converter.

4. The SR controller of claim 3, wherein k equals two.

5. The SR controller of claim 1, wherein the SR controller is further configured to control the multiplexer to select for the filtered version of the drain-to-source voltage responsive to a switching on of the SR switch transistor.

6. The SR controller of claim 1, wherein the SR controller is further configured to control the multiplexer to select for the filtered version of the drain-to-source voltage responsive to an expiration of a delay following a switching on of the SR switch transistor.

7. The SR controller of claim 1, wherein the SR controller is further configured to control the multiplexer to select for the filtered version of the drain-to-source voltage responsive to switching off of the SR switch transistor.

8. The SR controller of claim 1, wherein the SR controller is further configured to control the multiplexer to select for the filtered version of the drain-to-source voltage responsive to an expiration of a delay following a switching off of the SR switch transistor.

9. The SR controller of claim 1, further comprising
   a latch configured to be set by the assertion of the switch-on signal; and
   a gate driver configured to charge a gate of the SR switch transistor responsive to a set of the latch.

10. The SR controller of claim 9, further comprising:
    a second comparator configured to reset the latch responsive to the output signal exceeding an SR-off threshold voltage, wherein the gate driver is further configured to discharge the gate of the SR switch transistor responsive to a reset of the latch.

11. A synchronous rectifier (SR) controller, comprising:
    a deglitch filter for filtering a drain-to-source voltage for an SR switch transistor responsive to an adaptive delay to produce a filtered version of the drain-to-source voltage;
    a deglitch control circuit configured to control the adaptive delay to equal a first value responsive to a detection that a power switch connected to a primary winding for a flyback converter has been switched on; and
    a first comparator configured to assert a switch-on signal for the SR switch transistor responsive to the filtered version of the drain-to-source voltage being less than an SR-on threshold voltage, wherein the deglitch control circuit is further configured to control the adaptive delay to equal a second value responsive to a detection that the SR switch transistor has been switched on, wherein the second value is greater than the first value.

12. The SR controller of claim 11, wherein the deglitch control circuit is further configured to integrate a function of the drain-to-source voltage to determine whether the power switch has been switched on.

13. The SR controller of claim 12, wherein the function equals the drain-to-source voltage minus a product of a coefficient k with an output voltage for the flyback converter.

14. The SR controller of claim 13, wherein k equals two.

15. A method of synchronous rectification in a flyback converter, comprising:
- disabling a deglitch filter responsive to a determination that a power switch connected to a primary winding in the flyback converter has been switched on;
- while the deglitch filter is disabled, switching on a synchronous rectifier (SR) switch transistor connected to a secondary winding for the flyback converter responsive to a drain-to-source voltage for the SR switch transistor falling below an SR-on threshold voltage;
- subsequent to the SR switch transistor being switched on, enabling the deglitch filter to produce a filtered version of the drain-to-source voltage that filters out glitches on the drain-to-source voltage; and
- comparing the filtered version of the drain-to-source voltage to the SR-on threshold voltage to determine whether to switch on the SR switch transistor.

16. The method of claim 15, wherein enabling the deglitch filter is responsive to an expiration of a delay following the switching on of the SR switch transistor.

17. The method of claim 15, further comprising:
- integrating a function of the drain-to-source voltage to produce an integrated signal;
- determining whether the integrated signal exceeds a primary-on threshold voltage to determine whether the power switch transistor has been switched on.

18. The method of claim 17, wherein integrating the function comprises integrating a difference between the drain-to-source voltage and a product of a coefficient k with an output voltage for the flyback converter.

19. The method of claim 18, wherein the coefficient equals two.

20. The method of claim 15, further comprising:
- switching off the SR switch transistor responsive to a determination that the drain-to-source voltage exceeds an SR-off threshold voltage.

21. A synchronous rectifier (SR) controller, comprising:
- a first comparator configured to assert a first comparator output signal for responsive to a drain-to-source for an SR switch transistor being less than an SR-on threshold voltage;
- a deglitch filter for filtering the first comparator output signal to produce a filtered comparator output signal;
- a multiplexer for selecting between the first comparator output signal and the filtered comparator output signal to produce a multiplexer output signal;
- a deglitch control circuit configured to control the multiplexer to select for the first comparator output signal responsive to a detection that a power switch connected to a primary winding for a flyback converter has been switched on; and
- a switch driver configured to switch on the SR switch transistor responsive to an assertion of the multiplexer output signal.

22. The SR controller of claim 21, wherein the deglitch control circuit is further configured to integrate a function of the drain-to-source voltage to determine whether the power switch has been switched on.

23. The SR controller of claim 22, wherein the function equals the drain-to-source voltage minus a product of a coefficient k with an output voltage for the flyback converter.

24. The SR controller of claim 23, wherein k equals two.

25. A method of synchronous rectification in a flyback converter, comprising:
- disabling a deglitch filter responsive to a determination that a power switch connected to a primary winding in the flyback converter has been switched on;
- comparing a drain-to-source voltage for a synchronous rectifier (SR) switch transistor connected to a secondary winding for the flyback converter to an SR-on threshold voltage to produce a first comparator output signal;
- while the deglitch filter is disabled, switching on the SR switch transistor responsive to an assertion of the first comparator output signal;
- subsequent to the SR switch transistor being switched on, enabling the deglitch filter to produce a filtered version of the first comparator output signal; and
- while the deglitch filter is enabled, switching on the SR switch transistor in response to an assertion of the filtered version of the first comparator output signal.

26. The method of claim 25, wherein producing the filtered version of the first comparator output signal comprises delaying a rising edge of the first comparator output signal.

27. The method of claim 25, wherein enabling the deglitch filter is responsive to an expiration of a delay following the switching on of the SR switch transistor.

28. The method of claim 25, further comprising:
- integrating a function of the drain-to-source voltage to produce an integrated signal;
- determining whether the integrated signal exceeds a primary-on threshold voltage to determine whether the power switch transistor has been switched on.

29. The method of claim 28, wherein integrating the function comprises integrating a difference between the drain-to-source voltage and a product of a coefficient k with an output voltage for the flyback converter.

30. The method of claim 29, wherein the coefficient equals two.

* * * * *